(12) United States Patent (10) Patent No.: US 8,728,240 B2
Liu et al. (45) Date of Patent: May 20, 2014

(54) APPARATUS FOR VAPOR CONDENSATION AND RECOVERY

(71) Applicants: Benjamin Y. H. Liu, North Oaks, MN (US); Thuc M. Dinh, Shakopee, MN (US); Yamin Ma, Roseville, MN (US)

(72) Inventors: Benjamin Y. H. Liu, North Oaks, MN (US); Thuc M. Dinh, Shakopee, MN (US); Yamin Ma, Roseville, MN (US)

(73) Assignee: MSP Corporation, Shoreview, MN (US)

( * ) Notice: Subject to any disclaimer, the term of this patent is extended or adjusted under 35 U.S.C. 154(b) by 0 days.

(21) Appl. No.: 13/680,331

(22) Filed: Nov. 19, 2012

(65) Prior Publication Data

US 2013/0295749 A1 Nov. 7, 2013

Related U.S. Application Data

(60) Provisional application No. 61/641,519, filed on May 2, 2012.

(51) Int. Cl.
*C23C 16/00* (2006.01)
*F25B 21/02* (2006.01)
*F25J 1/00* (2006.01)

(52) U.S. Cl.
USPC .................. 118/715; 118/724; 156/345.29

(58) Field of Classification Search
USPC ............................. 118/715, 724; 156/345.29
See application file for complete search history.

(56) References Cited

U.S. PATENT DOCUMENTS

| | | | |
|---|---|---|---|
| 3,170,130 A * | 2/1965 | Begley | 336/55 |
| 4,551,197 A | 11/1985 | Guilmette et al. | |
| 6,099,649 A | 8/2000 | Schmitt et al. | |
| 6,206,971 B1 * | 3/2001 | Umotoy et al. | 118/715 |
| 6,358,485 B1 | 3/2002 | Baker | |
| 6,814,812 B2 * | 11/2004 | Tong et al. | 118/715 |
| 6,833,024 B2 | 12/2004 | Holst et al. | |
| 6,906,922 B2 * | 6/2005 | Yu et al. | 361/697 |
| 7,329,292 B2 * | 2/2008 | Mardian et al. | 55/282 |
| 7,425,224 B2 | 9/2008 | Nguyen | |
| 7,695,700 B2 | 4/2010 | Holst et al. | |
| 2001/0004879 A1 * | 6/2001 | Umotoy et al. | 118/715 |
| 2001/0050053 A1 * | 12/2001 | Umotoy et al. | 118/715 |
| 2004/0150952 A1 * | 8/2004 | Yu et al. | 361/697 |
| 2005/0064211 A1 | 3/2005 | Deavenport et al. | |
| 2006/0162658 A1 * | 7/2006 | Weidman | 118/715 |

(Continued)

FOREIGN PATENT DOCUMENTS

EP 0771887 A1 5/1997
JP 10266958 10/1998

(Continued)

OTHER PUBLICATIONS

Extended European Search Report; 12007832.4; Apr. 25, 2013.
Office Action. Korean Intellectual Property Office. Korean Patent Application No. 10-2012-0153147. Oct. 11, 2013.

*Primary Examiner* — Jeffrie R Lund
(74) *Attorney, Agent, or Firm* — Westman, Champlin & Koehler, P.A.; Z. Peter Sawicki; Amonla Prose

(57) ABSTRACT

Methods and apparatus for recovery of precursor vapor from a gas and precursor vapor mixture used in a deposition process. The gas and precursor vapor mixture is passed through a multitude of heat transfer surfaces in a heat conducting housing causing the precursor vapor to condense. The precursor vapor in liquid form is then collected after condensation.

4 Claims, 3 Drawing Sheets

(56) References Cited

U.S. PATENT DOCUMENTS

| | | | |
|---|---|---|---|
| 2006/0267192 A1* | 11/2006 | Chen | 257/724 |
| 2008/0206445 A1 | 8/2008 | Peck et al. | |
| 2008/0314559 A1* | 12/2008 | Hsu et al. | 165/80.4 |
| 2010/0110636 A1* | 5/2010 | Chou | 361/702 |
| 2011/0206842 A1 | 8/2011 | Revankar et al. | |
| 2012/0250333 A1* | 10/2012 | Chou | 362/351 |
| 2013/0295749 A1* | 11/2013 | Liu et al. | 438/478 |
| 2013/0295776 A1* | 11/2013 | Liu et al. | 438/778 |

FOREIGN PATENT DOCUMENTS

| | | |
|---|---|---|
| JP | 2001015498 A | 1/2001 |
| KR | 100477546 A | 3/2005 |
| WO | 0129281 A1 | 4/2001 |
| WO | 2007106462 A2 | 9/2007 |

\* cited by examiner

US 8,728,240 B2

APPARATUS FOR VAPOR CONDENSATION AND RECOVERY

BACKGROUND OF THE DISCLOSURE

Thin film deposition for semiconductor device fabrication is generally carried out through a gas phase process, such as chemical vapor deposition (CVD), plasma-enhanced chemical vapor deposition (PECVD) or atomic layer deposition (ALD). In such a process a liquid chemical precursor is generally vaporized with the help of a carrier gas to form a vapor/gas mixture. The mixture then flows into a deposition chamber for thin film deposition on a substrate. The deposition chamber is usually maintained at a vacuum in order to meet the desired process conditions.

Following deposition, the gas/vapor mixture then flows through a vacuum pump for exhaust to the ambient atmosphere. During its passage through the pump, the vapor, which is chemically reactive, can react with the pump oil to change the physical and/or chemical characteristics of the oil. Over time, the pump oil becomes contaminated with the reactive precursor vapor and is no longer capable of maintaining the deposition chamber at the desired vacuum pressure. When this occurs, the system must be shut down for pump maintenance, leading to the loss of productivity for the deposition system.

To reduce the frequency of pump maintenance, various exhaust treatment devices have been developed and used in the semiconductor industry. They range from devices that use high temperature plasma to decompose the precursor vapor to systems that inject vapor to react with the precursor vapor to render them less harmful. While these measures can prolong or extend the operating life of the pump, they do not provide a permanent solution for the problem.

SUMMARY OF THE DISCLOSURE

In this disclosure, an apparatus is described for recovery of precursor vapor from a gas and precursor vapor mixture that is used for deposition in a semiconductor fabrication process. The apparatus comprises a housing with an inlet for the gas and precursor vapor mixture to flow into the housing. The housing also includes a first outlet for the gas of the gas precursor vapor mixture to flow out of. A second outlet of the housing permits the precursor liquid formed from the precursor vapor condensation to be discharged from the housing. The housing is maintained at a temperature sufficient for the precursor vapor to condense and form the precursor liquid.

The apparatus may include a thermal electric cooler for controlling the temperature of the housing to a selected value for condensing the precursor vapor to form the precursor liquid. The housing may be made of a heat conducting metal such as aluminum. A multitude of heat conducting surfaces for heat transfer are included in the housing which dissipates heat outside of the housing.

This disclosure also includes a method for recovery of precursor vapor from a gas and precursor mixture after use in deposition in a semiconductor fabrication process. After use in deposition, the gas/precursor mixture is directed through a multitude of heat transfer surfaces in a heat conducting housing causing precursor vapor in the gas and precursor mixture to condense. The precursor liquid foamed through condensation from the precursor vapor is collected in a reservoir.

The method may include the additional steps of removing heat produced by precursor vapor condensation through the use of a thermal electric cooler so that the heat is removed through a multitude of heat transfer surfaces to outside of the housing.

Additionally, the gas and precursor mixture may be passed through a filter to remove suspended particles in the mixture prior to the gas and precursor mixture's use in deposition.

This disclosure also includes a method of fabricating integrated circuit devices including the steps of generating a gas and precursor vapor mixture; passing the gas and precursor vapor mixture through a deposition chamber to form a thin film on a substrate; and condensing unused precursor vapor of the gas and precursor vapor mixture in a condenser to collect condensed precursor vapor in liquid form.

This method also may include the additional step of removing heat produced by the precursor vapor condensation through the use of a thermal electric cooler that dissipates the heat through a multitude of heat transfer surfaces to outside of the housing.

Additionally, the gas and precursor mixture is passed through a filter to remove suspended particles in the mixture prior to the gas and precursor mixture entry into the deposition chamber.

DESCRIPTION OF THE EXEMPLARY EMBODIMENTS

The present disclosure describes a method and an apparatus for condensing the precursor vapor to form a precursor liquid downstream of the deposition chamber. The condensed liquid is substantially unchanged in its physical and/or chemical characteristics from the original precursor liquid used for film deposition. The collected liquid can be purified for recycling and reused or be disposed of in a safe manner to minimize the potential harmful effect on the environment.

Figure 1:
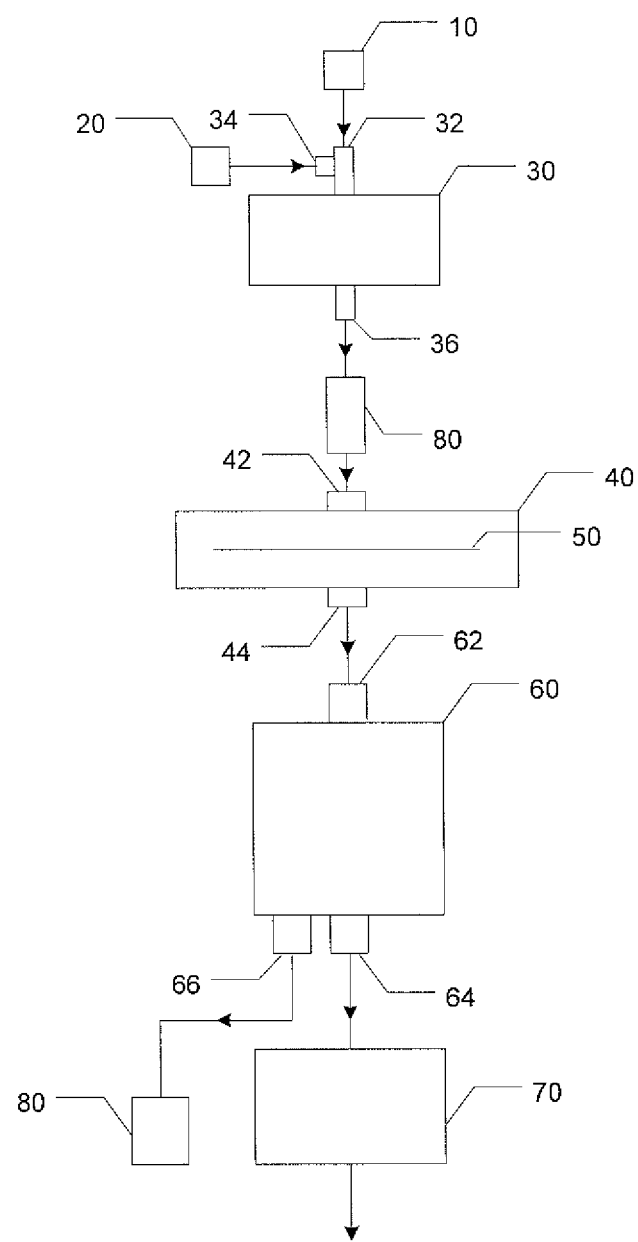
FIG. 1 is a schematic diagram of a semiconductor thin film deposition system in which the vapor recovery condenser of the present disclosure is used to condense vapor for recovery.

FIG. 1 is a schematic diagram of a semiconductor thin film deposition system including a vapor recovery condenser of the present disclosure placed downstream of the deposition chamber to reduce pump oil contamination and improve the reliability of the film deposition system. Like reference characters will be used for like elements throughout the figures. The system includes a vapor generating apparatus 30, which can be a bubbler or a direct liquid injection vaporizer. The more widely used direct liquid injection vaporizer is shown for convenience.

Vaporizer 30 of FIG. 1 is provided with a gas inlet, 32, a liquid inlet, 34, and an outlet 36. Gas inlet 32 is connected to a pressurized gas source, 10, containing the desired carrier gas. Liquid inlet 34 is connected to a pressurized liquid source 20 containing the precursor liquid to be vaporized. Vaporizer 30 is generally heated to a specific operating temperature. As the gas and liquid flow through the vaporizer at the desired rates of gas and liquid flow, the gas is heated and the liquid is vaporized to form vapor at substantially the same temperature. The resulting gas/vapor mixture then flows out of vaporizer 30 through outlet 36 into a filter, 80, to remove suspended particles that may be present in the gas/vapor mixture. The clean gas/vapor mixture then flows into deposition chamber 40 through chamber inlet 42 to form thin film on substrate 50. The gas/vapor mixture then flows out of deposition chamber 40 through outlet 44.

The system is typically provided with gas and liquid flow controllers in order to control the gas and liquid flow rates to the desired set point values. The vaporizer and deposition chamber are usually heated by electric heaters. They are also provided with temperature controllers in order to operate the vaporizer and the deposition chamber to their respective temperature settings. In addition, the deposition is typically carried out in vacuum. The required vacuum pressure is typically achieved by means of a vacuum pressure sensor and a vacuum pressure controller in order to operate the system at a specific vacuum pressure. For simplicity, all of these controllers including the sensors that form part of the control system for the semiconductor thin film deposition tool are not shown explicitly.

A variety of carrier gases has been used for thin film deposition. Inert gases such as nitrogen, helium and argon are quite common. Gases such as hydrogen and oxygen are also used in some applications. Precursor liquids such as TEOS (tetra ethyl ortho silicate), $TiCl_4$ (titanium tetra chloride), various metal organic compounds, and compounds such as TEMAH (tetraethyl amino hafnium) and TEMAZ (tetraethyl amino zirconium) for hi-k (high dielectric constant) film deposition by ALD (atomic layer deposition) processes are also widely used.

In the conventional vapor generation and deposition system a vacuum pump, 70, is located downstream of deposition chamber 40 in order to maintain the deposition chamber 40 to a desired vacuum pressure. Vacuum pump, 70, then exhausts the gas/vapor mixture to the ambient atmosphere.

The thin film deposition system of FIG. 1 also includes a vapor condensing apparatus 60, which is provided with an inlet 62 for the vapor and carrier gas mixture from deposition chamber to enter, an outlet 66 for the condensed liquid to exit, an external reservoir 80 for capture and store the condensed liquid, and an outlet, 64, for the carrier gas to exit. The carrier gas is substantially free of the precursor vapor, which has been condensed and collected by the vapor condensing apparatus 60, then enters pump 60 for exhaust to the ambient.

Unlike prior art exhaust treatment systems that are designed to destroy the precursor vapor to prevent or reduce pump contamination, the vapor condensing apparatus of the present disclosure condenses the precursor vapor without substantially changing its chemical nature or its physical characteristics. The condensed precursor liquid is generally quite pure. The collected liquid can be stored in the external reservoir 80. Alternatively, the condensed liquid can be stored internally in the vapor condensing apparatus 60 from which the stored liquid can be drained out of the system from time to time for safe disposal or reuse.

Figure 2:
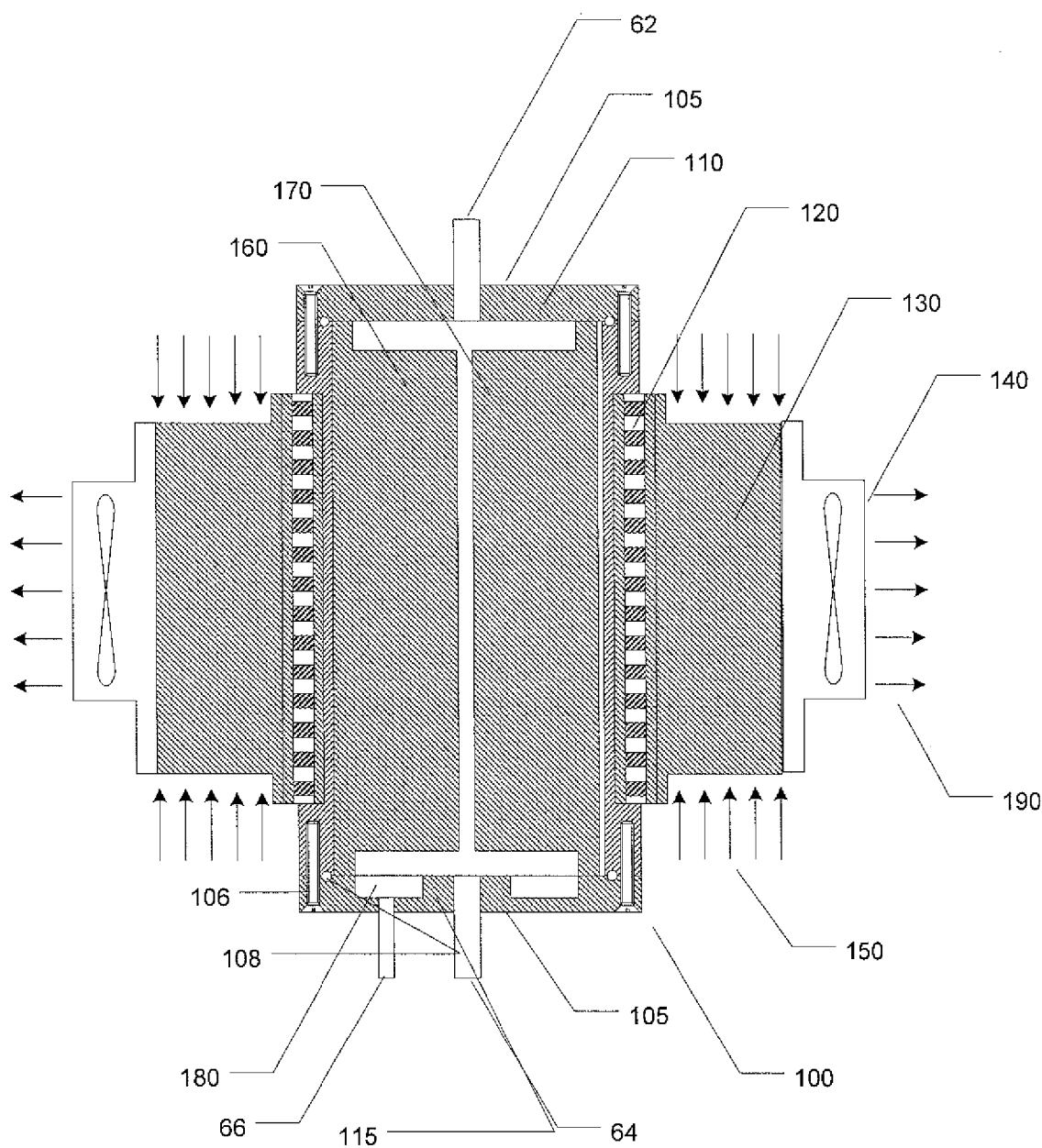
FIG. 2 is a vertical sectional view of the vapor condensing apparatus of the present disclosure in its preferred embodiment.

FIG. 2 shows a vertical sectional view of vapor condensing apparatus 60 of FIG. 1. The apparatus is shown generally located at 100 with an inlet, 62, for the gas/vapor mixture to enter and an outlet 66 for the condensed liquid to flow out. The gas, which is substantially free of the precursor vapor, then exits the vapor condensing apparatus 100 through outlet 64 and flows into vacuum pump 70 for exhaust to the ambient atmosphere.

The vapor condensing apparatus 100 generally operates under vacuum. It is provided with a vacuum tight envelop 105 with removable cover plates, 110 and 115, that are held in place by screws, 106, and gaskets, 108. Alternatively, cover plates 110 and 115 can be permanently welded in place to form a vacuum tight envelop. Apparatus 100 is generally constructed of a heat conducting metal, such as aluminum. A thermoelectric cooler 120 is placed in good thermal contact with the heat conducting metal envelop 105 in order to control its temperature to a suitably low value, typically below about 25 degrees C. Within the vacuum tight envelop, there are multitudes of heat transfer surfaces 160 and 170 that are in good thermal contact with the heat conducting envelop. Since heat transfer surfaces 160 and 170 are in good thermal contact with the heat conducting metal envelop 105, the temperature of these heat transfer surfaces 160 and 170 is also substantially the same as that of envelop 105 and is thus also below about 25° C.

As the gas/vapor mixture flows along heat transfer surfaces 160 and 170 within the vacuum tight envelop 105, precursor vapor will condense on these heat transfer surfaces to cause it to form liquid on the surfaces. This precursor condensed liquid will then flow by gravity along these surfaces into the annular liquid collecting trough 180 below. The condensed liquid will then flow out of trough 180 through exit 66 into external reservoir 80 shown in FIG. 1

When vapor condenses on the heat transfer surfaces 160 and 170, the vapor condensation release heat. This heat will be transferred by conduction to the vacuum tight envelop 105 for it to be carried away by the thermoelectric cooler 150 and rejected to the ambient atmosphere by the external heat transfer surface 130. A cooling fan 140 will draw air from ambient causing it to flow in the indicated direction of the arrows 150 and blowing this air back to the ambient in the direction of arrows 190.

Thermoelectric cooler 120 is typically operated by DC power and controlled by a temperature sensor to a selected temperature by feedback electronic control. Such controls are familiar to those skilled in the art of temperature control the thermoelectric cooler and will not be further described.

Figure 3:
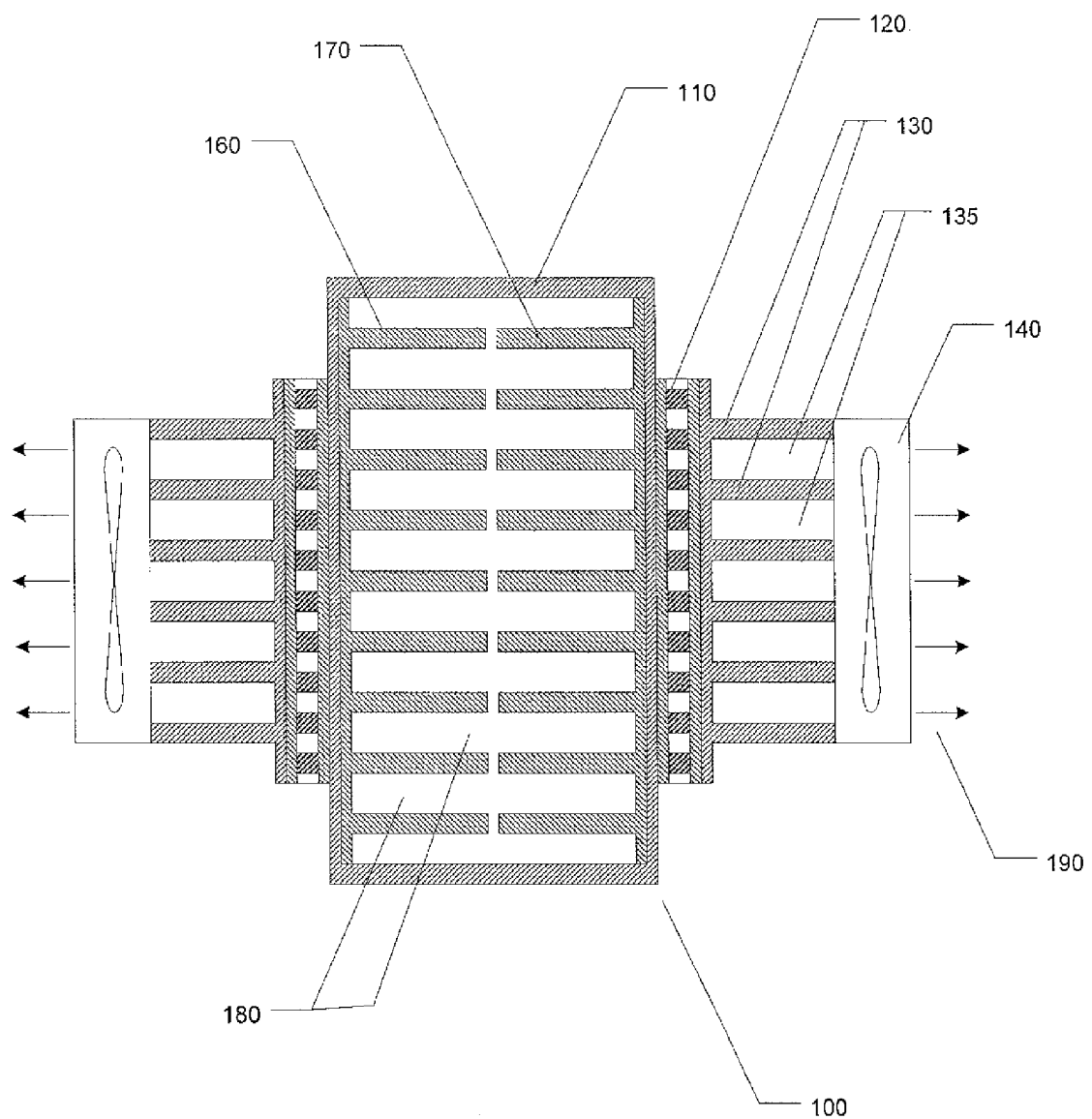
FIG. 3 is a horizontal sectional view of the vapor condensing apparatus of the present disclosure in its preferred embodiment.

FIG. 3 is a horizontal sectional view of the vapor condensing apparatus of the present disclosure in its preferred embodiment. The internal heat transfer surfaces are spaced apart from each other by gaps of empty spaces 180. These empty spaces form flow channels through which the vapor/gas mixture can flow through, thus permitting the vapor to condense on the vertical surfaces 160 and 170. Similarly, external heat transfer surfaces 130 also form vertical flow channels 135 to allow cooling air from the ambient atmosphere to flow through and be blown by cooling fan 140 in the general direction of arrows 190.

Although the present invention has been described with reference to referred embodiments, workers skilled in the art will recognize that changes may be made in form and detail without departing from the spirit and scope of the invention.

What is claimed is:

1. An apparatus for recovery of precursor vapor from a gas and precursor vapor mixture used for deposition in a semiconductor fabrication process, the apparatus comprising a vacuum tight housing with an inlet for said gas and precursor vapor mixture to flow into the housing, a first outlet for gas of the gas and precursor vapor mixture to flow out of the housing, and a second outlet for a precursor liquid formed from precursor vapor condensation to be discharged from the housing, said housing having a multitude of internal heat conducting surfaces for heat transfer inside said housing and having a multitude of heat conducting surfaces for heat dissipation outside said housing, said housing being maintained at a temperature sufficient for said precursor vapor to condense and form the precursor liquid by a cooler in thermal contact with the housing and the housing positioned between the internal heat conducting surfaces and the heat conducting surfaces outside of said housing such that the cooler is in thermal contact with both the internal heat conducting surfaces and the heat conducting surfaces for dissipation outside said housing.

2. The apparatus of claim 1 wherein the cooler is a thermoelectric cooler for controlling said temperature of said housing to a selected value for condensing said precursor vapor to form the precursor liquid.

3. The apparatus of claim 1 said housing is made of a heat-conducting metal.

4. The apparatus of claim 3 said metal is aluminum.

* * * * *